(12) United States Patent
He

(10) Patent No.: US 9,620,606 B2
(45) Date of Patent: Apr. 11, 2017

(54) METHOD FOR MANUFACTURING THIN FILM TRANSISTOR, AND THIN FILM TRANSISTOR THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventor: Zongze He, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/176,388

(22) Filed: Jun. 8, 2016

(65) Prior Publication Data

US 2016/0284809 A1 Sep. 29, 2016

Related U.S. Application Data

(63) Continuation of application No. 14/080,265, filed on Nov. 14, 2013, now abandoned.

(30) Foreign Application Priority Data

Nov. 15, 2012 (CN) .......................... 2012 1 0460335

(51) Int. Cl.
*H01L 29/78* (2006.01)
*H01L 29/786* (2006.01)
(Continued)

(52) U.S. Cl.
CPC ...... *H01L 29/42384* (2013.01); *G02F 1/1368* (2013.01); *G02F 1/13439* (2013.01);
(Continued)

(58) Field of Classification Search
CPC ..................... H01L 29/78618; H01L 29/66765
(Continued)

(56) References Cited

U.S. PATENT DOCUMENTS

| 5,466,621 A | 11/1995 | Hisamoto et al. |
| 2007/0075372 A1* | 4/2007 | Terashima ........ H01L 29/42392 257/360 |

(Continued)

FOREIGN PATENT DOCUMENTS

| CN | 101385156 A | 3/2009 |
| CN | 101540340 A | 9/2009 |

(Continued)

OTHER PUBLICATIONS

First Office Action regarding Chinese application No. 201210460335.2, dated Aug. 26, 2014. Translation provided by Dragon Intellectual Property Law Firm.

(Continued)

*Primary Examiner* — Kimberly Rizkallah
*Assistant Examiner* — Brian Turner
(74) *Attorney, Agent, or Firm* — Harness, Dickey & Pierce, P.L.C.

(57) ABSTRACT

The present disclosure relates to the field of liquid crystal display, and provides a method for manufacturing a TFT and the TFT thereof. The TFT includes: a base substrate; a gate electrode with a three-dimensional structure formed on the base substrate; a gate insulating layer for completely covering a top face and two side faces of the gate electrode; a semiconductor layer for completely covering a top face and two side faces of the gate insulating layer; a buffer layer for covering a top face and two side faces of the semiconductor layer at two ends of the semiconductor layer; and source and drain electrodes for completely covering a top face and two side faces of the buffer layer, wherein the semiconductor layer of the TFT is of a three-dimensional structure.

16 Claims, 7 Drawing Sheets

(51) Int. Cl.

| | | |
|---|---|---|
| *H01L 29/66* | (2006.01) | |
| *H01L 33/08* | (2010.01) | |
| *H01L 21/302* | (2006.01) | |
| *H01L 21/331* | (2006.01) | |
| *H01L 29/423* | (2006.01) | |
| *G02F 1/1343* | (2006.01) | |
| *G02F 1/1368* | (2006.01) | |
| *H01L 21/02* | (2006.01) | |
| *H01L 27/12* | (2006.01) | |
| *H01L 29/45* | (2006.01) | |
| *H01L 29/49* | (2006.01) | |

(52) U.S. Cl.
CPC .. *G02F 1/134309* (2013.01); *H01L 21/02532* (2013.01); *H01L 21/02576* (2013.01); *H01L 21/02592* (2013.01); *H01L 27/1222* (2013.01); *H01L 27/1262* (2013.01); *H01L 29/42376* (2013.01); *H01L 29/45* (2013.01); *H01L 29/495* (2013.01); *H01L 29/4908* (2013.01); *H01L 29/4966* (2013.01); *H01L 29/6675* (2013.01); *H01L 29/78696* (2013.01)

(58) Field of Classification Search
USPC ...... 257/57, 59, E33.004, 665, 291; 438/149
See application file for complete search history.

(56) References Cited

U.S. PATENT DOCUMENTS

| | | | | |
|---|---|---|---|---|
| 2010/0243295 | A1* | 9/2010 | Allemand | B82Y 10/00 |
| | | | | 174/250 |
| 2010/0258869 | A1* | 10/2010 | Morita | H01L 21/76283 |
| | | | | 257/347 |
| 2012/0193719 | A1* | 8/2012 | Or-Bach | H01L 21/6835 |
| | | | | 257/368 |
| 2012/0305893 | A1* | 12/2012 | Colinge | B82Y 10/00 |
| | | | | 257/29 |
| 2013/0105897 | A1* | 5/2013 | Bangsaruntip | B82Y 10/00 |
| | | | | 257/351 |
| 2014/0175515 | A1* | 6/2014 | Then | H01L 29/772 |
| | | | | 257/194 |

FOREIGN PATENT DOCUMENTS

| | | |
|---|---|---|
| CN | 102437178 A | 5/2012 |
| CN | 102709326 A | 10/2012 |
| CN | 202487578 U | 10/2012 |
| CN | 202523718 U | 11/2012 |
| JP | 2005085777 A | 3/2005 |

OTHER PUBLICATIONS

Second Office Action regarding Chinese application No. 201210460335.2, dated Dec. 31, 2014. Translation provided by Dragon Intellectual Property Law Firm.

* cited by examiner

METHOD FOR MANUFACTURING THIN FILM TRANSISTOR, AND THIN FILM TRANSISTOR THEREOF

CROSS-REFERENCE TO RELATED APPLICATION

The present application claims priority to the Chinese patent application No. 201210460335.2, filed on Nov. 15, 2012, and U.S. application Ser. No. 14/080,265, filed on Nov. 14, 2013, each of which is incorporated herein by reference in its entirety.

TECHNICAL FIELD

The present disclosure relates to the field of liquid crystal display, in particular to a method for manufacturing a thin film transistor and the thin film transistor thereof.

BACKGROUND

In the field of display, flat-panel displays with high PPI (Pixels per inch) values have become a key competition for manufacturers. However, in the case that a panel has a high PPI value, a number of issues in, for example, power consumption and light transmission will occur. As a result, it has become a technical problem to increase a saturation current and ensure a certain charging rate by increasing a channel width in the case of a reduced opaque area for a thin film transistor (TFT) array substrate.

For the conventional TFT array substrate, its channel and gate electrode layer are each of a flat structure as a film, so it is impossible to fully and reasonably utilize a spatial volume to increase the saturation current.

SUMMARY

An object of the present disclosure is to provide a method for manufacturing a TFT and the TFT thereof, so as to reduce, to some extent, a driving voltage, the power consumption of a driving circuit and an area occupied by the TFT, and to increase a light transmission rate.

In one aspect, the present disclosure provides in some embodiments a method for manufacturing a TFT, including steps of:
providing a base substrate;
forming a gate electrode with a three-dimensional structure on the base substrate; forming a gate insulating layer for completely covering a top face and two side faces of the gate electrode;
forming a semiconductor layer for completely covering a top face and two side faces of the gate insulating layer;
forming a buffer layer at two ends of the semiconductor layer for covering a top face and two side faces of the semiconductor layer; and
forming a source electrode and a drain electrode for completely covering a top face and two side faces of the buffer layer,
wherein a three-dimensional structure of the TFT includes an X-axis direction, a Y-axis direction and a Z-axis direction orthogonal to each other, a positive X-axis direction represents a transmission direction of carriers of the TFT, and the Y-axis direction is perpendicular to a plane where the base substrate is located,
the buffer layer is formed at the two ends of the semiconductor layer in the X-axis direction, the source electrode and the drain electrode cover the buffer layer at the two ends of the semiconductor layer, and a portion of the top face of the semiconductor layer between the source electrode and the drain electrode and portions of the two side faces of the semiconductor layer between the source electrode and the drain electrode form channel regions, and
the two side faces of each of the gate insulating layer, the semiconductor layer and the buffer layer are located at two sides of the gate electrode in the Z-axis direction.

Alternatively, the three-dimensional structure of the gate electrode is a cuboid or cube.

Alternatively, a three-dimensional structure of the semiconductor layer is an inverted-U slot structure covering the gate electrode.

Alternatively, a portion of the semiconductor layer between the source and drain electrodes forms a channel. A length of the channel is equal to a distance between the source and drain electrodes, and a width of the channel≥(a width of the gate electrode in the Z-axis direction+2*a height of the gate electrode in the Y-axis direction).

Alternatively, the step of forming the gate electrode with the three-dimensional structure on the base substrate includes:
depositing a first metal layer on the base substrate; and
treating the first metal layer by a patterning process to form the gate electrode with the three-dimensional structure.

Alternatively, the first metal layer is made of indium tin oxide (ITO), or a metal selected from the group consisting of Cr, Mo, Al, Nd, Mo, W, Ti, Ta and Cu, or an alloy thereof.

Alternatively, the step of forming the gate insulating layer for covering the gate electrode on the base substrate on which the gate electrode is formed includes:
depositing an insulating material on the base substrate on which the gate electrode is formed; and
treating the insulating material by a patterning process to form the gate insulating layer on the top face and the two side faces of the gate electrode.

Alternatively, the step of forming the semiconductor layer on the base substrate on which the gate insulating layer is formed includes:
depositing a semiconductor material on the base substrate on which the gate insulating layer is formed; and
treating the semiconductor material by a patterning process to form the semiconductor layer on the top face and the two side faces of the gate insulating layer.

Alternatively, the step of forming the buffer layer on the base substrate on which the semiconductor layer is formed includes:
depositing an N+ amorphous silicon material on the base substrate on which the semiconductor layer is formed; and
treating the N+ amorphous silicon material by a patterning process to form the buffer layer on the top face and the two side faces of the semiconductor layer at the two ends of the semiconductor layer.

Alternatively, the step of forming the source electrode and the drain electrode for completely covering the top face and the two side faces of the buffer layer includes:
depositing a second metal layer on the base substrate on which the buffer layer is formed; and
treating the second metal layer by a patterning process to form the source electrode and drain electrode on the top face and the two side faces of the buffer layer.

Alternatively, the second metal layer is made of a metal selected from the group consisting of Cr, Mo, Al, Nd, Mo, W, Ti, Ta and Cu, or an alloy thereof.

In another aspect, the present disclosure provides in some embodiments a TFT, including:

a base substrate;

a gate electrode with a three-dimensional structure formed on the base substrate;

a gate insulating layer for completely covering a top face and two side faces of the gate electrode;

a semiconductor layer for completely covering a top face and two side faces of the gate insulating layer;

a buffer layer for covering a top face and two side faces of the semiconductor layer at two ends of the semiconductor layer; and a source electrode and a drain electrode for completely covering a top face and two side faces of the buffer layer, wherein a three-dimensional structure of the TFT includes an X-axis direction, a Y-axis direction and a Z-axis direction orthogonal to each other, a positive X-axis direction represents a transmission direction of carriers of the TFT, and the Y-axis direction is perpendicular to a plane where the base substrate is located, the buffer layer is formed at the two ends of the semiconductor layer in the X-axis direction, the source electrode and the drain electrode cover the buffer layer at the two ends of the semiconductor layer, and a portion of the top face of the semiconductor layer between the source electrode and the drain electrode and portions of the two side faces of the semiconductor layer between the source electrode and the drain electrode form channel regions, and the two side faces of each of the gate insulating layer, the semiconductor layer and the buffer layer are located at two sides of the gate electrode in the Z-axis direction.

Alternatively, the three-dimensional structure of the gate electrode is a cuboid or cube.

Alternatively, a three-dimensional structure of the semiconductor layer is an inverted-U slot structure covering the gate electrode.

Alternatively, a portion of the semiconductor layer between the source and drain electrodes forms a channel. A length of the channel is equal to a distance between the source and drain electrodes, and a width of the channel≥(a width of the gate electrode in the Z-axis direction+2*a height of the gate electrode in the Y-axis direction).

Alternatively, the channel of the TFT includes at least three electronic gates.

According to the embodiments of the present disclosure, the number of the electronic gates will be increased due to the use of the TFT with the three-dimensional structure, that is, in the case of an identical gate voltage and an identical area occupied by the TFT, the TFT in the embodiments of the present disclosure has a saturation current larger than that of a conventional flat TFT. As a result, it is able to reduce, to some extent, the driving voltage, the power consumption of the driving circuit and the area occupied by the TFT, and to increase the light transmission rate.

DETAILED DESCRIPTION

First Embodiment

As shown in FIGS. 2-10, the present disclosure provides in this embodiment a method for manufacturing a TFT, including:

Step 1: providing a base substrate 11;

Step 2: forming a gate electrode with a three-dimensional structure on the base substrate 11;

Step 3: forming a gate insulating layer for completely covering a top face and two side faces of the gate electrode;

Step 4: forming a semiconductor layer for completely covering a top face and two side faces of the gate insulating layer;

Step 5: forming a buffer layer at two ends of the semiconductor layer for covering a top face and two side faces of the semiconductor layer; and Step 6: forming a metal layer on the base substrate on which the buffer layer is formed, and treating the metal layer by a patterning process to form a source electrode and a drain electrode for completely covering a top face and two side faces of the buffer layer, wherein the semiconductor layer of the TFT is of a three-dimensional structure.

A three-dimensional structure of the TFT includes an X-axis direction, a Y-axis direction and a Z-axis direction orthogonal to each other, a positive X-axis direction represents a transmission direction of carriers of the TFT, and the Y-axis direction is perpendicular to a plane where the base substrate is located.

The buffer layer is formed at the two ends of the semiconductor layer in the X-axis direction, the source electrode and the drain electrode cover the buffer layer at the two ends of the semiconductor layer, and a portion of the top face of the semiconductor layer between the source electrode and the drain electrode and portions of the two side faces of the semiconductor layer between the source electrode and the drain electrode form channel regions.

The two side faces of each of the gate insulating layer, the semiconductor layer and the buffer layer are located at two sides of the gate electrode in the Z-axis direction.

According to the embodiment of the present disclosure, the number of corresponding electronic gates are increased by forming the TFT with a three-dimensional structure on the base substrate, that is, the TFT in the embodiment of the present disclosure has a saturation current larger than that of a conventional flat TFT in the case of an identical gate voltage and an identical area occupied by the TFT. As a result, it is able to reduce, to some extent, a driving voltage, power consumption of the driving circuit and the area occupied by the TFT, and to increase a light transmission rate.

Figure 2:
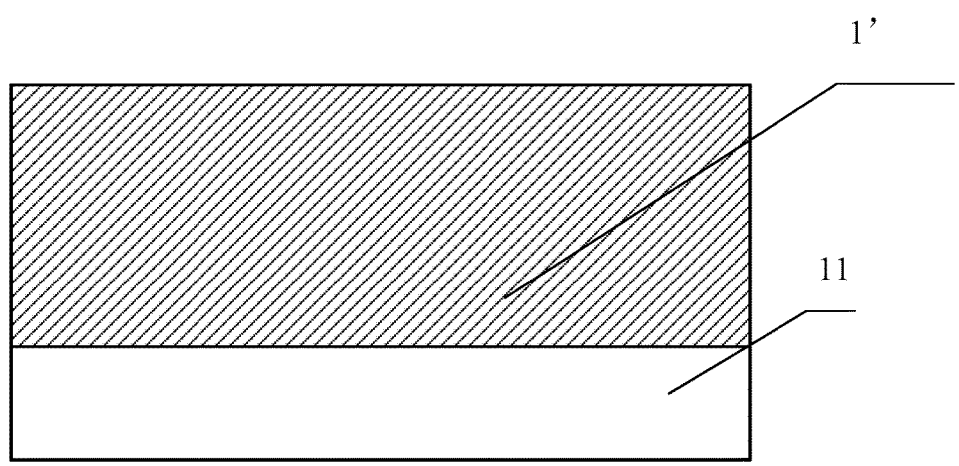
FIGS. 2-10 are schematic views showing a method for manufacturing the TFT according to one embodiment of the present disclosure.
Figure 3:
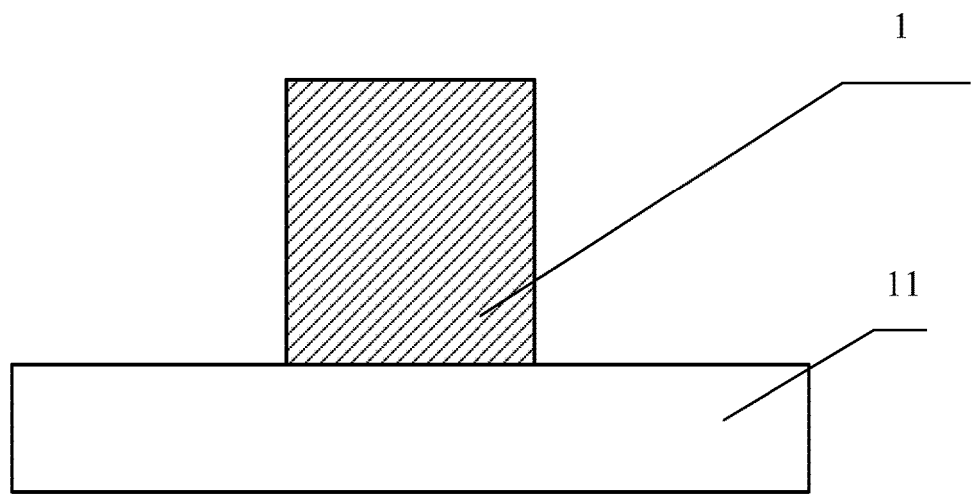

As shown in FIGS. 2 and 3, Step 2 includes:

Step 21: depositing a first metal layer 1' on the base substrate; and

Step 22: treating the first metal layer 1' by a patterning process to form the gate electrode 1 with a three-dimensional structure, wherein the three-dimensional structure is a cuboid.

The first metal layer 1' may be made of ITO, or a metal selected from the group consisting of Cr, Mo, Al, Nd, Mo, W, Ti, Ta and Cu, or an alloy thereof.

A conventional gate electrode is of a film structure with a very small thickness, while the gate electrode 1 in the embodiment of the present disclosure is of a three-dimensional structure with a thickness larger than a film. Alternatively, the gate electrode 1 has a shape of cuboid. Other structures may be further provided on the basis of the gate electrode 1 having the shape of cuboid so that the entire TFT has a cuboid structure. It should be appreciated that, cuboid is merely a preferred shape for the TFT so as to facilitate the production and machining, and the TFT may also be a cube or any other shapes with a cross section of trapezoid or arch, as long as it has a saturation current larger than a conventional flat TFT with a flat structure as a film in the case of an identical gate voltage and an identical area occupied by the TFT.

Figure 4:
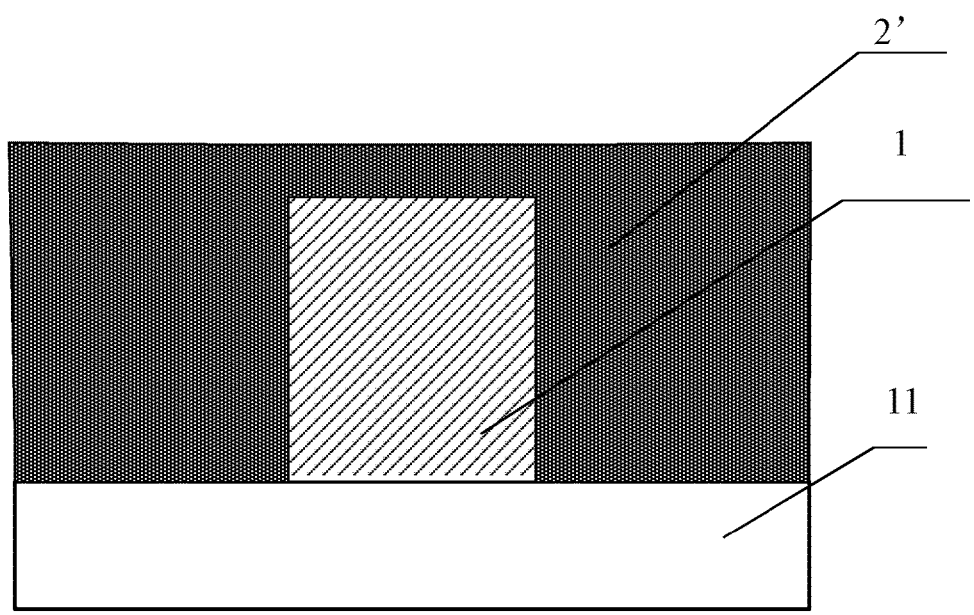
Figure 5:
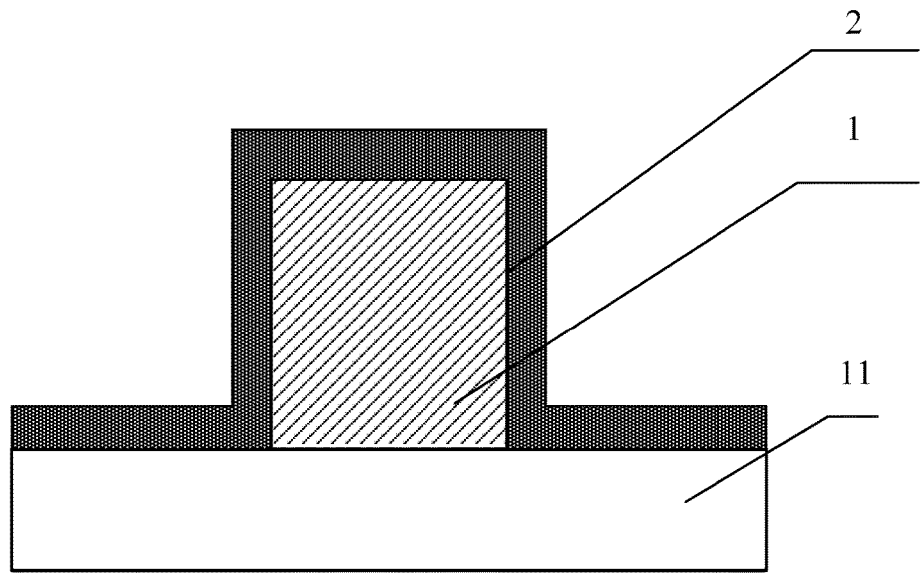

As shown in FIGS. 4 and 5, Step 3 includes:

Step 31: depositing an insulating material 2' on the base substrate 11 on which the gate electrode 1 with a cuboid structure is formed (as shown in FIG. 4); and Step 32: treating the insulating material 2' by a patterning process to form the gate insulating layer 2 on the top face and the two side faces of the gate electrode 1 (as shown in FIG. 5), wherein the gate insulating layer 2 may be made of oxides, nitrides or nitrogen oxides, such as SiNx.

Figure 6:
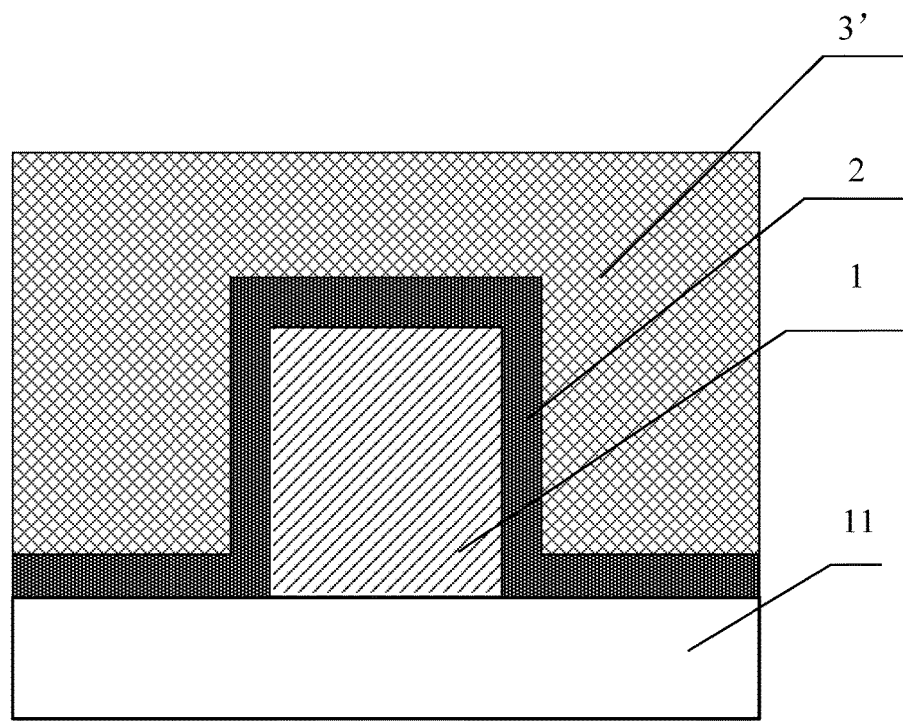
Figure 7:
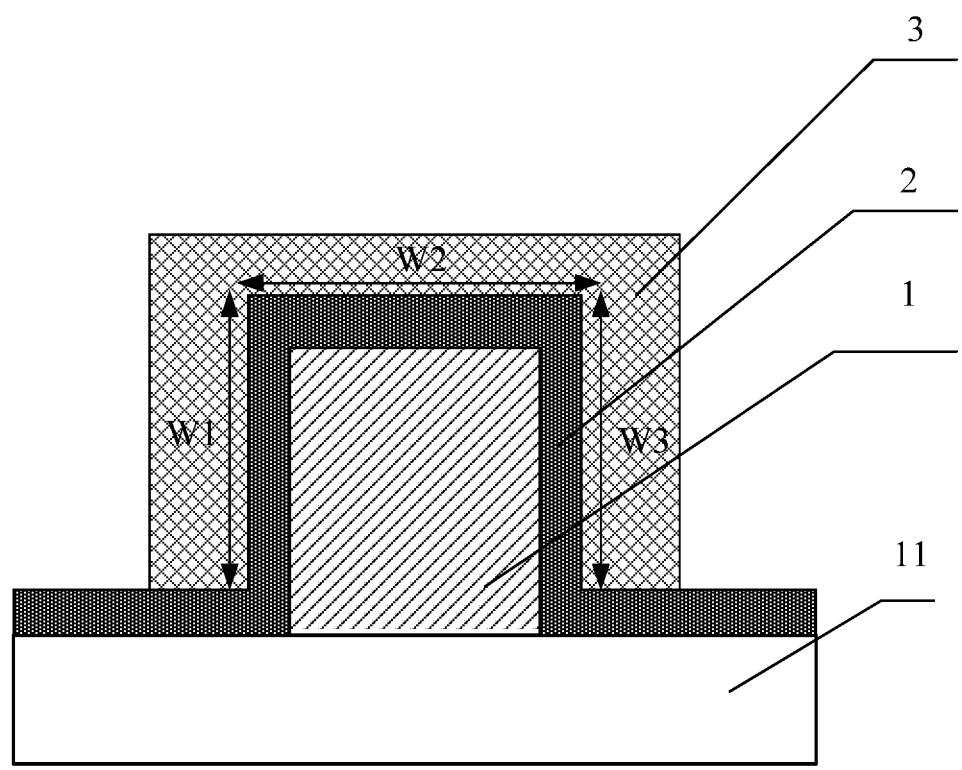

As shown in FIGS. 6 and 7, Step 4 includes:

Step 41: depositing a conductive material 3' on the base substrate 11 on which the gate insulating layer 2 is formed (as shown in FIG. 6); and Step 42: treating the conductive material 3' by a patterning process to form the semiconductor layer 3 on the gate insulating layer 2 (as shown in FIG. 7), wherein the three-dimensional structure of the semiconductor layer 3 is an inverted-U slot structure covering the gate electrode 1 (here, the structure of the semiconductor layer 3 is not limited, as long as it completely covers the gate electrode and has the structure corresponding to that of the gate electrode), and the semiconductor layer 3 may be made of a-Si.

Figure 8:
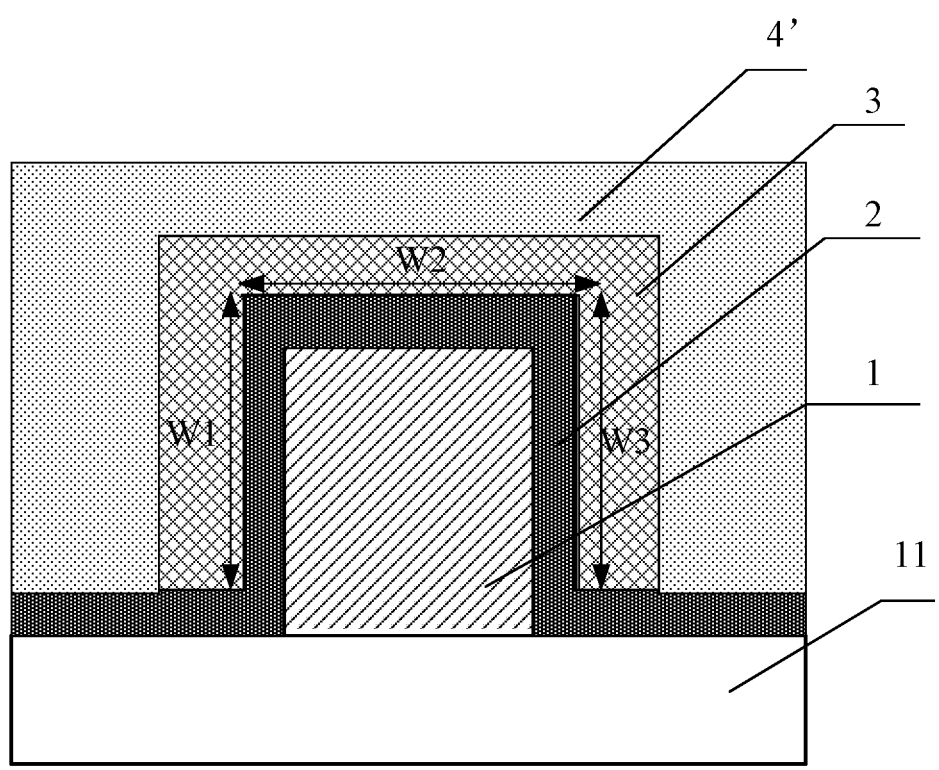
Figure 9:
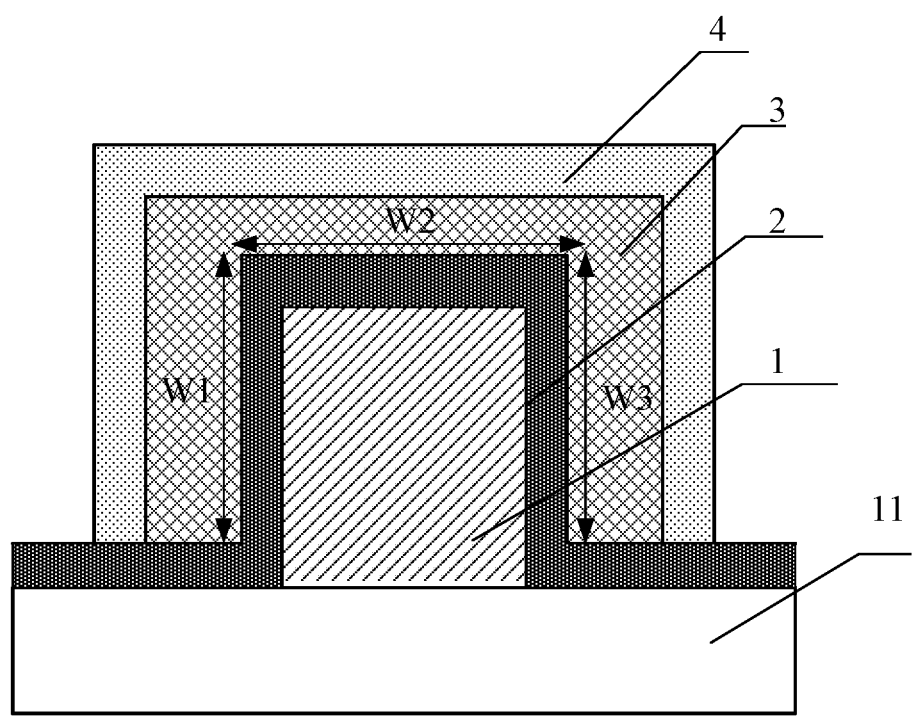

As shown in FIGS. 8 and 9, Step 5 includes:

Step 51: depositing an N+ amorphous silicon material 4' on the base substrate 11 on which the semiconductor layer 3 is formed (as shown in FIG. 8); and Step 52: treating the N+ amorphous silicon material 4' (such as N+ a-Si) by a patterning process to form the buffer layer 4 on the semiconductor layer 3 (as shown in FIG. 9), wherein the buffer layer 4 may be a doped or a non-doped semiconductor layer.

Figure 10:
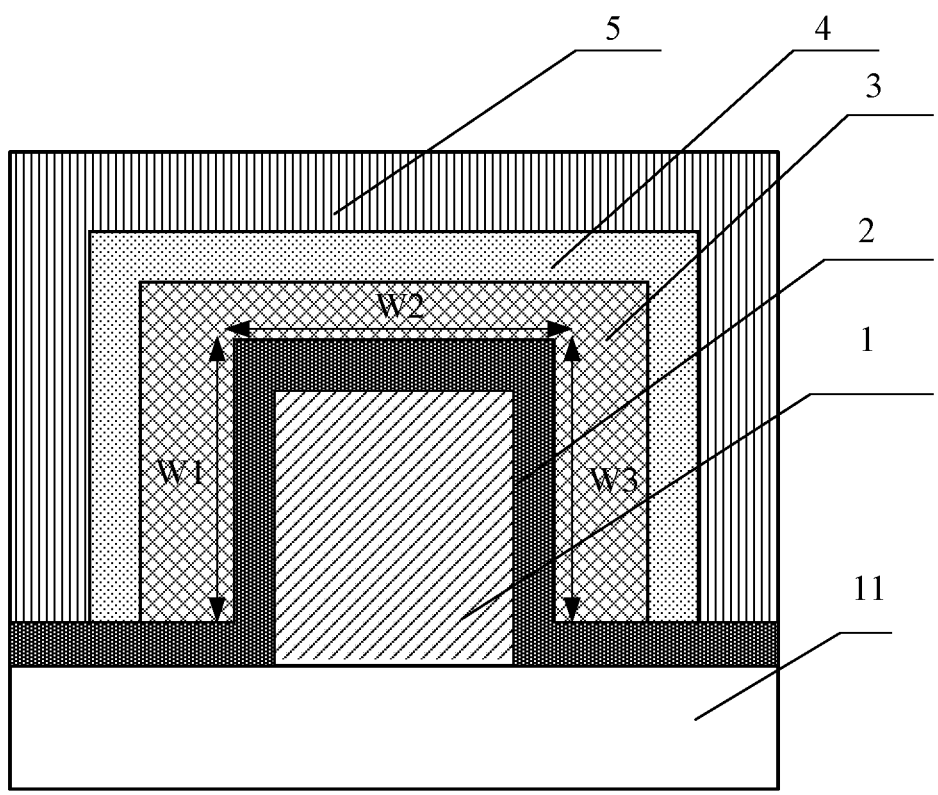

As shown in FIG. 10, Step 6 includes:

Step 61: depositing a second metal layer on the base substrate 11 on which the buffer layer 4 is formed; and Step 62: treating the second metal layer by a patterning process to finally form the source and drain electrodes 5 on the buffer layer 4 (as shown in FIG. 10), wherein the second metal layer may be made of a metal selected from the group consisting of Cr, Mo, Al, Nd, Mo, W, Ti, Ta and Cu, or an alloy thereof.

Figure 1:
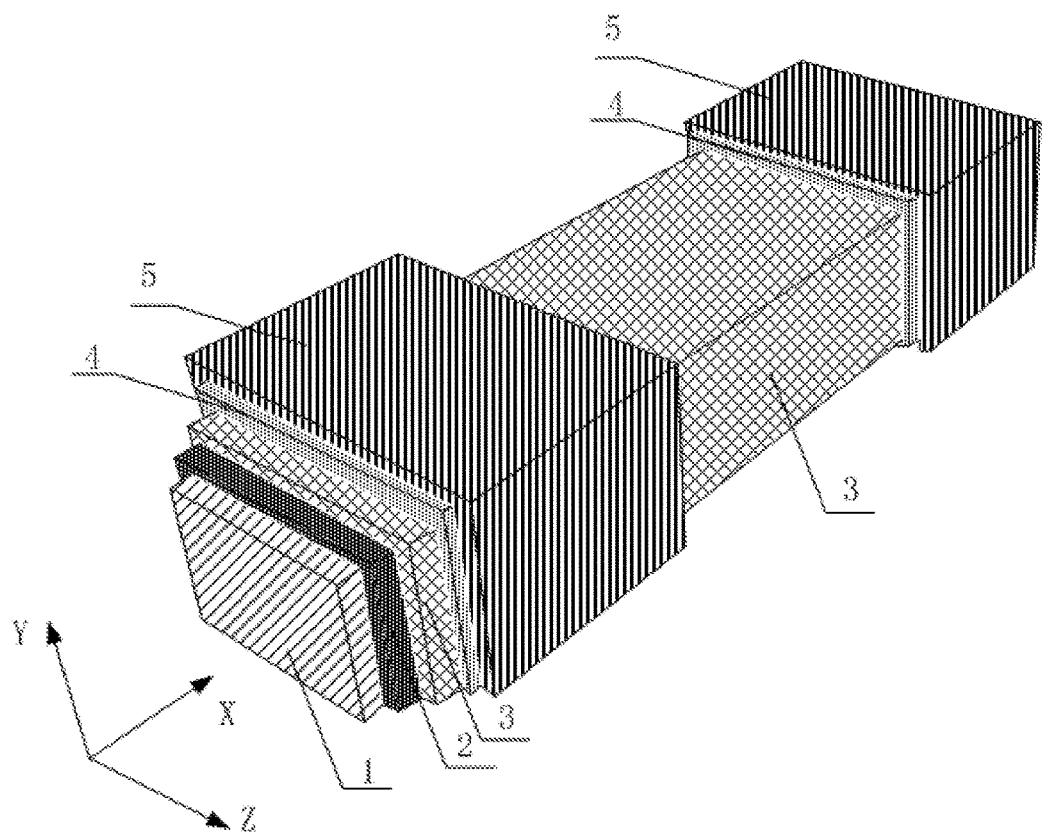
FIG. 1 is a schematic view showing a TFT according to one embodiment of the present disclosure.

FIG. 1 is a solid view showing the structure of the TFT with a three-dimensional structure finally obtained through the above-mentioned steps. The TFT with the three-dimensional structure will be described hereinafter in conjunction with FIG. 1. FIG. 1 shows the X-axis direction, the Y-axis direction and the Z-axis direction orthogonal to each other. An X-axis is perpendicular to a plane formed by a Y-axis and a Z-axis, the Y-axis is perpendicular to a plane formed by the X-axis and the Z-axis, and the Z-axis is perpendicular to a plane formed by the X-axis and the Y-axis. The positive X-axis direction represents the transmission direction of the carriers of the TFT, and the Y-axis is perpendicular to the plane where the base substrate is located.

In the X-axis direction, two ends of the TFT form the source and drain electrodes 5, and a channel region is formed between the source and drain electrodes 5.

FIG. 10 is a sectional view of the TFT along the Z-axis direction. The gate insulating layer 2 completely covers the top face and the two side faces of the gate electrode 1, the semiconductor layer 3 completely covers the top face and the two side faces of the gate insulating layer 2, the buffer layer 4 is formed at the two ends of the semiconductor layer 3 in the X-axis direction, and the source and drain electrodes 5 cover the buffer layer at the two ends of the semiconductor layer. A portion of the top face of the semiconductor layer between the source and drain electrodes 5 and portions of the two side faces of the semiconductor layer between the source and drain electrodes 5 form channel regions. Alternatively, the two side faces of the gate electrode 1 are perpendicular to the top face of the gate electrode 1, the two side faces of the gate insulating layer 2 are perpendicular to the top face of the gate insulating layer 2, the two side faces of the semiconductor layer 3 are perpendicular to the top face of the semiconductor layer 3, and the two side faces of the buffer layer 4 are perpendicular to the top face of the buffer layer 4.

As show in FIG. 7, the three-dimensional structure of the semiconductor layer 3 may be an inverted-U slot structure covering the gate electrode, Due to this structure, the semiconductor layer 3 has three planes. A conductive channel will be formed in these planes during the operation of the TFT, so these planes constitute conductive gates, i.e., three electronic gates.

A portion of the semiconductor layer 3 between the source and drain electrodes 5 forms a channel. A length of the channel is equal to a distance between the source and drain electrodes. A width W of the channel≥(W1+W2+W3). W1 and W3 each represent a height of the gate electrode in the Y-axis, and W2 represents a width of the gate electrode in the Z-axis. As compared to the channel (with a width such as W2) for a conventional flat structure, W is obviously greater than W2. Hence, according to the TFT with a three-dimensional structure in the embodiment of the present disclosure, the effective channel width is increased remarkably, so that the number of the electronic gates is increased correspondingly, e.g., at least three electronic gates. The TFT in the embodiment of the present disclosure has a saturation current greater than that of a conventional flat TFT in the case of an identical gate voltage and an identical area occupied by the TFT. As a result, it is able to reduce, to some extent, the driving voltage, the power consumption of the driving circuit and the area occupied by the TFT, and to increase the light transmission rate.

According to the equation $$I_{saturation} = \frac{W}{L} \cdot K \cdot (V_{GS} - V_{TH})^2,$$

it can be seen that the saturation current will increase along with the channel width. In the equation, W represents a channel width, $V_{GS}$ represents a voltage of the gate electrode 1 relative to the semiconductor layer 3, $V_{TH}$ represents a minimum voltage desired for the induction of a carrier, K represents a Boltzmann constant, and L represents an effective channel length. As a result, it is able to reduce, to some extent, the driving voltage, the power consumption of the driving circuit and the area occupied by the TFT, and to increase the light transmission rate.

Second Embodiment

As shown in FIGS. 1-10, the present disclosure provides in this embodiment a TFT, including: a base substrate; a gate electrode 1 with a three-dimensional structure formed on the base substrate; a gate insulating layer 2 for completely covering a top face and two side faces of the gate electrode 1; a semiconductor layer 3 for completely covering a top face and two side faces of the gate insulating layer 2; a buffer layer 4 for covering a top face and two side faces of the semiconductor layer 3 at two ends of the semiconductor layer 3; and source and drain electrodes for completely covering a top face and two side faces of the buffer layer 4. A three-dimensional structure of the TFT includes an X-axis direction, a Y-axis direction and a Z-axis direction orthogonal to each other, a positive X-axis direction represents a transmission direction of carriers of the TFT, and the Y-axis direction is perpendicular to a plane where the base substrate is located. The buffer layer 4 is formed at the two ends of the semiconductor layer 3 in the X-axis direction, the source electrode and the drain electrode 5 cover the buffer layer 4 at the two ends of the semiconductor layer 3, and a portion of the top face of the semiconductor layer 3 between the source electrode and the drain electrode 5 and portions of the two side faces of the semiconductor layer 3 between the source electrode and the drain electrode 5 form channel regions. The two side faces of each of the gate insulating layer 2, the semiconductor layer 3 and the buffer layer 4 are located at two sides of the gate electrode 1 in the Z-axis direction. A channel formed on the TFT is of a three-dimensional structure, e.g., a cuboid as shown in FIG. 1. The channel of the TFT includes at least three electronic gates.

Other structures may be further provided on the basis of the gate electrode 1 with a cuboid structure so that the entire TFT also has a cuboid structure. It should be appreciated that, cuboid is merely a preferred shape for the TFT so as to facilitate the production and machining, and the TFT may also be a cube or any other shapes, as long as it has a saturation current larger than a conventional flat TFT with a flat structure as a film in the case of an identical gate voltage and an identical area occupied by the TFT.

The TFT has a three-dimensional structure, so the number of the electronic gates may be increased, that is, the TFT has a saturation current greater than that of a conventional flat TFT in the case of an identical gate voltage and an identical area occupied by the TFT. According to the equation $$I_{saturation} = \frac{W}{L} \cdot K \cdot (V_{GS} - V_{TH})^2,$$

it can be seen that the saturation current will increase along with the channel width. In the equation, W represents a channel width, $V_{GS}$ represents a voltage of the gate electrode 1 relative to the semiconductor layer 3, $V_{TH}$ represents a minimum voltage desired for the induction of a carrier, K represents a Boltzmann constant, and L represents an effective channel length. As a result, it is able to reduce, to some extent, the driving voltage, the power consumption of the driving circuit and the area occupied by the TFT, and to increase the light transmission rate.

The above are merely the preferred embodiments of the present disclosure. It should be appreciated that, a person skilled in the art may make further improvements and modifications without departing from the principle of the present disclosure, and these improvements and modifications shall also fall within the scope of the present disclosure.

What is claimed is:
1. A method for manufacturing a thin film transistor (TFT), comprising:
   providing a base substrate;
   forming a gate electrode with a three-dimensional structure on the base substrate;
   forming a gate insulating layer for completely covering a top face and two side faces of the gate electrode;
   forming a semiconductor layer for completely covering a top face and two side faces of the gate insulating layer;
   forming a buffer layer at two ends of the semiconductor layer for covering a top face and two side faces of the semiconductor layer; and
   forming a source electrode and a drain electrode for completely covering a top face and two side faces of the buffer layer,
   wherein a three-dimensional structure of the TFT comprises an X-axis direction, a Y-axis direction and a Z-axis direction orthogonal to each other, a positive X-axis direction represents a transmission direction of carriers of the TFT, and the Y-axis direction is perpendicular to a plane where the base substrate is located,
   the buffer layer is formed at the two ends of the semiconductor layer in the X-axis direction, the source electrode and the drain electrode cover the buffer layer at the two ends of the semiconductor layer, and a portion of the top face of the semiconductor layer between the source electrode and the drain electrode and portions of the two side faces of the semiconductor layer between the source electrode and the drain electrode form channel regions, and
   the two side faces of each of the gate insulating layer, the semiconductor layer and the buffer layer are located at two sides of the gate electrode in the Z-axis direction.
2. The method according to claim 1, wherein the three-dimensional structure of the gate electrode is a cuboid or cube.
3. The method according to claim 2, wherein the step of forming the gate electrode with the three-dimensional structure on the base substrate comprises:
   depositing a first metal layer on the base substrate; and
   treating the first metal layer by a patterning process to form the gate electrode with the three-dimensional structure.
4. The method according to claim 3, wherein the first metal layer is made of indium tin oxide (ITO), or a metal selected from the group consisting of Cr, Mo, Al, Nd, Mo, W, Ti, Ta and Cu, or an alloy thereof.
5. The method according to claim 2, wherein the step of forming a gate insulating layer for completely covering a top face and two side faces of the gate electrode comprises:
   depositing an insulating material on the base substrate on which the gate electrode with a cuboid structure is formed; and
   treating the insulating material by a patterning process to form the gate insulating layer on the top face and the two side faces of the gate electrode.
6. The method according to claim 2, wherein the step of forming a semiconductor layer for completely covering a top face and two side faces of the gate insulating layer comprises:
   depositing a semiconductor material on the base substrate on which the gate insulating layer is formed; and
   treating the semiconductor material by a patterning process to form the semiconductor layer on the top face and the two side faces of the gate insulating layer.

7. The method according to claim 2, wherein the step of forming a buffer layer at two ends of the semiconductor layer for covering a top face and two side faces of the semiconductor layer comprises:
 depositing an N+ amorphous silicon material on the base substrate on which the semiconductor layer is formed; and
 treating the N+ amorphous silicon material layer by a patterning process to form the buffer layer on the top face and the two side faces of the semiconductor layer at the two ends of the semiconductor layer.

8. The method according to claim 2, wherein the step of forming the source electrode and the drain electrode for completely covering the top face and the two side faces of the buffer layer comprises:
 depositing a second metal layer on the base substrate on which the buffer layer is formed; and
 treating the second metal layer by a patterning process to form the source and drain electrodes on the top face and the two side faces of the buffer layer.

9. The method according to claim 8, wherein the second metal layer is made of a metal selected from the group consisting of Cr, Mo, Al, Nd, Mo, W, Ti, Ta and Cu, or an alloy thereof.

10. The method according to claim 1, wherein a three-dimensional structure of the semiconductor layer is an inverted-U slot structure covering the gate electrode.

11. The method according to claim 10, wherein a portion of the semiconductor layer between the source and drain electrodes forms a channel, a length of the channel is equal to a distance between the source and drain electrodes, and a width of the channel≥(a width of the gate electrode in the Z-axis direction+2*a height of the gate electrode in the Y-axis direction).

12. A thin film transistor (TFT), comprising:
 a base substrate;
 a gate electrode with a three-dimensional structure formed on the base substrate;
 a gate insulating layer for completely covering a top face and two side faces of the gate electrode;
 a semiconductor layer for completely covering a top face and two side faces of the gate insulating layer;
 a buffer layer for covering a top face and two side faces of the semiconductor layer at two ends of the semiconductor layer; and
 a source electrode and a drain electrode for completely covering a top face and two side faces of the buffer layer,
 wherein a three-dimensional structure of the TFT comprises an X-axis direction, a Y-axis direction and a Z-axis direction orthogonal to each other, a positive X-axis direction represents a transmission direction of carriers of the TFT, and the Y-axis direction is perpendicular to a plane where the base substrate is located,
 the buffer layer is formed at the two ends of the semiconductor layer in the X-axis direction, the source electrode and the drain electrode cover the buffer layer at the two ends of the semiconductor layer, and a portion of the top face of the semiconductor layer between the source electrode and the drain electrode and portions of the two side faces of the semiconductor layer between the source electrode and the drain electrode form channel regions, and
 the two side faces of each of the gate insulating layer, the semiconductor layer and the buffer layer are located at two sides of the gate electrode in the Z-axis direction.

13. The TFT according to claim 12, wherein the three-dimensional structure of the gate electrode is a cuboid or cube.

14. The TFT according to claim 13, wherein a portion of the semiconductor layer between the source and drain electrodes forms a channel, a length of the channel is equal to a distance between the source and drain electrodes, and a width of the channel≥(a width of the gate electrode in the Z-axis direction+2*a height of the gate electrode in the Y-axis direction).

15. The TFT according to claim 14, wherein the channel of the TFT comprises at least three electronic gates.

16. The TFT according to claim 12, wherein a three-dimensional structure of the semiconductor layer is an inverted-U slot structure covering the gate electrode.

* * * * *